(12) United States Patent
Mun et al.

(10) Patent No.: US 11,862,693 B2
(45) Date of Patent: Jan. 2, 2024

(54) SEMICONDUCTOR DEVICES INCLUDING A DRAIN CAPTIVE STRUCTURE HAVING AN AIR GAP AND METHODS OF FORMING THE SAME

(71) Applicant: GLOBALFOUNDRIES Singapore Pte. Ltd., Singapore (SG)

(72) Inventors: Bong Woong Mun, Singapore (SG); Jeoung Mo Koo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 27 days.

(21) Appl. No.: 17/000,379

(22) Filed: Aug. 24, 2020

(65) Prior Publication Data
US 2022/0059665 A1 Feb. 24, 2022

(51) Int. Cl.
| | | |
|---|---|---|
| H01L 29/417 | (2006.01) | |
| H01L 29/40 | (2006.01) | |
| H01L 29/78 | (2006.01) | |
| H01L 21/768 | (2006.01) | |

(52) U.S. Cl.
CPC .... *H01L 29/41775* (2013.01); *H01L 21/7682* (2013.01); *H01L 29/401* (2013.01); *H01L 29/402* (2013.01); *H01L 29/7816* (2013.01); *H01L 29/7835* (2013.01)

(58) Field of Classification Search
CPC .............. H01L 29/402; H01L 29/7816; H01L 29/7835; H01L 29/66659; H01L 21/7682; H01L 29/66681; H01L 29/404; H01L 23/5222; H01L 29/41758; H01L 29/4175; H01L 29/41775; H01L 29/401

USPC ........ 257/288, 339, 522, E21.581, E23.144, 257/E29.255, E29.256; 438/124, 197, 438/286, 619

See application file for complete search history.

(56) References Cited

U.S. PATENT DOCUMENTS

| | | | |
|---|---|---|---|
| 6,204,200 | B1 | 3/2001 | Shieh et al. |
| 9,356,073 | B1 * | 5/2016 | Kim ...................... H01L 23/528 |
| 9,653,347 | B1 * | 5/2017 | Leobandung ..... H01L 23/53266 |
| 10,211,146 | B2 | 2/2019 | He et al. |
| 10,461,152 | B2 | 10/2019 | Stamper et al. |
| 2010/0001345 | A1 * | 1/2010 | Furuhata ............. H01L 27/0922 257/E29.261 |

(Continued)

FOREIGN PATENT DOCUMENTS

| | | |
|---|---|---|
| EP | 2034044 A2 | 3/2009 |
| JP | 2002353444 A * | 12/2002 |

*Primary Examiner* — David Chen
(74) *Attorney, Agent, or Firm* — VIERING JENTSCHURA & PARTNER MBB (57) ABSTRACT

A semiconductor device may include a substrate having a source region and a drain region, and a gate arranged over the substrate and between the source region and the drain region. A first interlevel dielectric (ILD) layer may be at least partially arranged over the substrate and the gate. A conductive field plate may be arranged over the first ILD layer. At least one drain contact may extend through the first ILD layer over the drain region and may be coupled to the conductive field plate. A drain captive structure may be disposed in the first ILD layer and adjacent to the drain region, the drain captive structure having a trench comprising an air gap, wherein the drain captive structure is laterally spaced apart from sidewalls of the gate.

20 Claims, 8 Drawing Sheets

(56) References Cited

U.S. PATENT DOCUMENTS

| | | | |
|---|---|---|---|
| 2012/0037962 A1* | 2/2012 | Breyta | H01L 23/4821 |
| | | | 257/288 |
| 2013/0277741 A1 | 10/2013 | Guowei et al. | |
| 2015/0123199 A1* | 5/2015 | Chen | H01L 29/7816 |
| | | | 438/286 |
| 2016/0380062 A1* | 12/2016 | Zhang | H01L 29/402 |
| | | | 257/409 |
| 2018/0145132 A1* | 5/2018 | Mori | H01L 29/66689 |
| 2019/0103490 A1* | 4/2019 | Warrick | H01L 29/7831 |
| 2019/0259751 A1* | 8/2019 | Pala | H01L 21/823418 |
| 2019/0288063 A1* | 9/2019 | Komatsu | H01L 29/0696 |
| 2020/0411415 A1* | 12/2020 | Wu | H01L 23/4821 |
| 2021/0066500 A1* | 3/2021 | Liu | H01L 21/823807 |
| 2021/0104630 A1* | 4/2021 | Chung | H01L 29/7816 |
| 2021/0134973 A1* | 5/2021 | Huang | H01L 21/76897 |

* cited by examiner

SEMICONDUCTOR DEVICES INCLUDING A DRAIN CAPTIVE STRUCTURE HAVING AN AIR GAP AND METHODS OF FORMING THE SAME

TECHNICAL FIELD

The present disclosure relates generally to semiconductor devices, and more particularly to metal oxide semiconductor field effect transistor devices and methods of forming the same.

BACKGROUND

Metal oxide semiconductor field effect transistor (MOSFET) devices have been widely employed for various applications such as power amplifiers and RF switches for telecommunications equipment such as smartphones. It is desirable to have the breakdown voltage of an MOS device be as high as possible with a fast switching speed while keeping the on-state resistance as low as possible. However, processing techniques employed to achieve these parameters typically contradict one another, thereby presenting a key trade-off situation as it relates to the ultimate performance of the MOS device. For example, the breakdown voltage of the device may be increased by reducing the doping levels in the drift well, but this reduction in the doping levels of the drift well increases the on-state resistance of the device. Thus, the key for the design of the device is to increase the breakdown voltage without increasing the on-state resistance, or reducing the on-state resistance without reducing the breakdown voltage of the device.

It is desirable to provide a MOSFET device with high breakdown voltage, high switching speed and low on-state resistance and methods of forming thereof.

SUMMARY

Embodiments generally relate to semiconductor devices and methods of forming thereof. According to various embodiments, a semiconductor device may include a substrate having a source region and a drain region, and a gate arranged over the substrate and between the source region and the drain region. A first interlevel dielectric (ILD) layer may be at least partially arranged over the substrate and the gate. A conductive field plate may be arranged over the first ILD layer. At least one drain contact may extend through the first ILD layer over the drain region and may be coupled to the conductive field plate. A drain captive structure may be disposed in the first ILD layer and adjacent to the drain region, the drain captive structure having a trench comprising an air gap, wherein the drain captive structure is laterally spaced apart from sidewalls of the gate.

According to various embodiments, a method of forming a semiconductor device is provided. The method may include providing a substrate having a source region and a drain region, a gate arranged over the substrate and between the source region and the drain region, and a first interlevel dielectric (ILD) layer at least partially arranged over the substrate and the gate. At least one drain contact extending through the first ILD layer may be formed over the drain region. The method may further include forming a conductive field plate over the first ILD layer, and forming a drain captive structure in the first ILD layer and adjacent to the drain region, the drain captive structure having a trench comprising an air gap. The drain captive structure may be laterally spaced apart from sidewalls of the gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to semiconductor devices or integrated circuits (ICs). More particularly, some embodiments relate to transistor devices having a high switching performance. The transistor devices may be metal oxide semiconductor field effect transistors, such as EDMOS (extended drain metal oxide semiconductor) transistors. Other suitable transistor devices may also be useful. Such devices may be incorporated into or used with, for example, RF switches and power amplifiers.

Figure 1A:
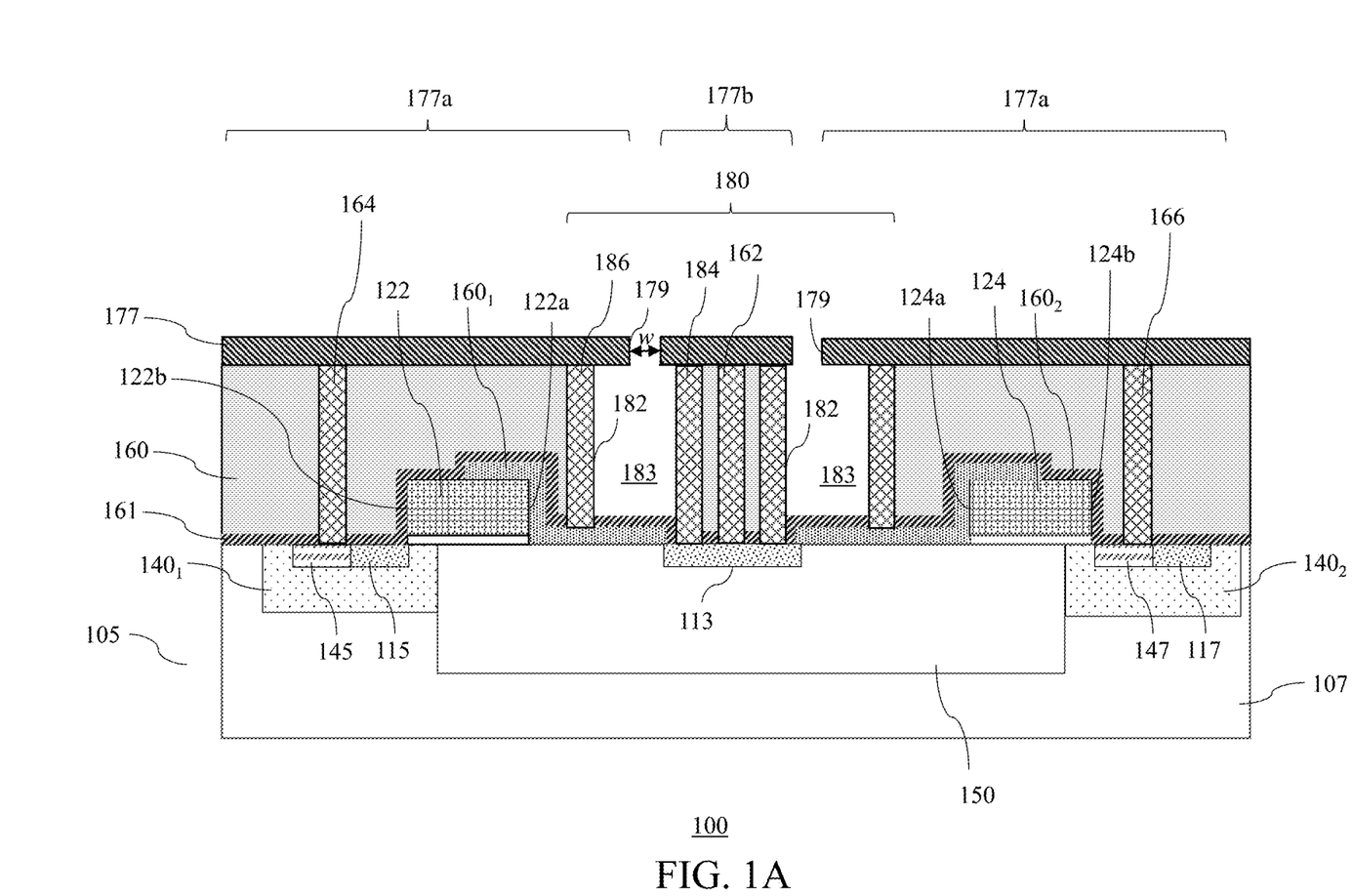
FIG. 1A shows a cross-sectional view of an embodiment of a device.

FIG. 1A shows a cross-sectional view of an embodiment of a semiconductor device 100. The device, for example, may be an IC. Other types of devices may also be useful. As shown, the device includes a substrate 105. The substrate 105 may be a semiconductor substrate, such as a silicon substrate. Other types of substrates, such as silicon germanium, germanium, gallium arsenide, or crystal-on-insulator (COI) such as silicon-on-insulator (SOI), may also be used.

The substrate 105 may include a device well 107. The device well 107, for example, may be a high voltage (HV) device well. The device well 107 may be provided for devices operating in high voltage ranges, for example, at a voltage ranging of about 5V to about 20V. Other suitable voltage values may also be useful.

A drain region 113 and a source region 115 may be disposed in the substrate 105. The drain region may be an extended drain region. The drain region 113 and the source region 115 may be doped with first polarity type dopants for a first polarity type transistor. For example, the first polarity type dopants may be p-type dopants for a PMOS. Alternatively, the first polarity type dopants may be n-type dopants for an NMOS. In a non-limiting example, p-type dopants may include boron (B), aluminum (Al), indium (In) or a combination thereof, while n-type dopants may include phosphorus (P), arsenic (As), antimony (Sb), or a combination thereof. The drain region 113 and the source region 115 may be heavily doped regions.

A (first) gate 122 may be arranged over the substrate. The gate 122 may be arranged between the drain region 113 and the source region 115. The gate 122 may include a first sidewall 122a and a second sidewall 122b. The gate 122 may include a gate electrode over a gate dielectric. The gate dielectric may be formed of an oxide layer, such as silicon oxide while the gate electrode may be formed of polysilicon, in a non-limiting example. Providing other types of material for the gate electrode and the gate dielectric may also be useful. The gate 122 may further include gate spacers on sidewalls of the gate electrode (not shown). The gate spacers may be dielectric spacers, such as silicon oxide spacers, in a non-limiting example. Other suitable types of dielectric materials may also be useful, such as silicon nitride or a combination of dielectric materials or layers.

According to various embodiments, the drain region 113 may be arranged spaced apart from the first sidewall 122a of the gate. The source region 115 may be disposed adjacent to the second sidewall 122b of the gate. In some embodiments, a silicide block layer $160_1$ may be arranged over the substrate between the gate 122 and the drain region 113. For example, the silicide block layer $160_1$ may extend from the first sidewall 122a of the gate 122 to the drain region 113. In some embodiments, the silicide block layer $160_1$ may extend over at least a portion of the gate 122.

A body well $140_1$ may be disposed in the substrate 105. The body well $140_1$ may be disposed adjacent to the second sidewall 122b of the gate 122 and extends at least partially under a first portion of the gate 122. For example, the body well $140_1$ may extend beyond the source region 115 and may underlap a first side of the gate 122. As shown, the body well $140_1$ may surround the source region 115. For example, the body well $140_1$ may be lightly or intermediately doped with second polarity dopants for a first polarity type transistor. The second polarity type is different or opposite to the first polarity type. For example, in the case the first polarity type dopants are n-type dopants, the second polarity type dopants are p-type dopants. Alternatively, in the case the first polarity type dopants are p-type dopants, the second polarity type dopants are n-type dopants. For example, the body well $140_1$ comprises p-type dopants for an n-type transistor or n-type dopants for a p-type transistor.

A well tap 145 may be disposed within the body well $140_1$ in the substrate and in communication with the body well $140_1$. The body well $140_1$ may surround the well tap 145. The well tap 145 may serve to bias the body well $140_1$. The well tap 145 may be disposed adjacent to the source region 115. In some embodiments, the well tap 145 may abut the source region 115. In other embodiments, the well tap 145 may be spaced apart from the source region 115. The well tap 145 may have the same polarity type as the body well $140_1$. For example, the well tap 145 may be doped with second polarity type dopants for a first polarity type transistor. For example, the well tap 145 be doped with p-type dopants for an n-type transistor. Alternatively, the well tap 145 may be doped with n-type dopants for a p-type transistor. In a non-limiting embodiment, the well tap 145 may be a heavily doped region, similar to the source and drain regions.

According to various embodiments, the substrate 105 may further include a second source region 117. A second gate 124 may be further arranged over the substrate between the second source region 117 and the drain region 113. The drain region 113 may be common to the gate 122 and the second gate 124. The second source region 117, for example, may be heavily doped with first polarity type dopants. The second gate 124 may include a first sidewall 124a and a second sidewall 124b. Similar to the gate 122, the second gate 124 may include a gate electrode over a gate dielectric, and gate spacers on sidewalls of the gate electrode (not shown). The drain region 113 may be arranged spaced apart from the first sidewall 124a of the gate. The second source region 117 may be disposed adjacent to the second sidewall 124b of the gate. In some embodiments, a silicide block layer $160_2$ may be arranged over the substrate between the second gate 124 and the drain region 113. For example, the silicide block layer $160_2$ may extend from the first sidewall 124a of the gate 124 to the drain region 113. In some embodiments, the silicide block layer $160_2$ may extend over at least a portion of the second gate 124. Similarly, a second body well $140_2$ may be disposed adjacent to the second sidewall 124b of the second gate 124 and extends at least partially under a first portion of the second gate 124. For example, the second body well $140_2$ may extend beyond the second source region 117 and may underlap a first side of the second gate 124. As shown, the second body well $140_2$ may surround the second source region 117. A second well tap 147 may be disposed within the second body well $140_2$ in the substrate. The second body well $140_2$ may surround the second well tap 147. The second well tap 147 may be disposed adjacent to the second source region 117. For example, the second well tap 147 may be heavily doped with second polarity type dopants.

In some embodiments, metal silicide contacts may be provided over the gate electrode, source regions, drain region, and well tap (not shown). The silicide contacts, for example, may be or include, but are not limited to a nickel-based silicide, a cobalt silicide (CoSi), and combinations thereof. Other suitable types of metal silicide contacts may also be useful. The silicide contacts may be employed to reduce contact resistance and facilitate contact to back-end-of-line (BEOL) interconnects.

A drift well or region 150 may be disposed in the substrate 105. The drift well 150 may surround the drain region 113 and extends at least partially under a second portion of the gate 122 (and the second gate 124). The depth or bottom of the drift well 150 may be deeper than the body well $140_1$ and the second body well $140_2$ from the substrate surface. The depth, for example, may depend on the design voltage of the device. The substrate portion under the gate 122 disposed between the source region 115 and drift well 150 may form a channel region. Similarly, the substrate portion under the second gate 124 disposed between the second source region 117 and drift well 150 may form a channel region. The drift well 150 may include first polarity type dopants for a first polarity type transistor. For example, the drift well 150 may include n-type dopants for an n-type transistor or p-type dopants for a p-type transistor. The dopant concentration of the drift well 150 may be lower than the dopant concentration of the drain region 113. For example, the drift well 150 may be lightly doped. For example, the dopant concentration of the drift well 150 may depend on device requirement such as breakdown voltage and/or $R_{ON}$ performance.

According to various embodiments, the inner edge of the body well 140 (body well $140_1$ and the second body well $140_2$) under the gate 122 and the second gate 124 may be contiguous with the edge of the drift well 150. Other configurations of the body well 140 and the drift well 150 may also be useful.

In some embodiments, the device well 107 may surround or may encompass the body well 140, the drift well 150, source region 115, second source region 117 and drain region 113. The depth or bottom of the device well 107 may be below the body well 140 and the drift well 150. For example, the device well 107 may include second polarity type dopants for a first polarity type device. For example, the device well 107 may include p-type dopants for an n-type transistor. Alternatively, the device well 107 may include n-type dopants for a p-type transistor. The device well 107 may be lightly doped.

An interlevel dielectric (ILD) may be arranged over the substrate 105. The ILD may include ILD layers comprising interconnects. As illustrated in FIG. 1A, a first ILD layer 160 may be arranged over the substrate 105. The dielectric layer may be formed in a BEOL processing in a non-limiting example. The first ILD layer 160 may be formed of a dielectric material, such as silicon oxide in a non-limiting example. Other suitable types of dielectric materials are also useful. An etch stop layer 161, such as silicon nitride, may be arranged between the substrate 105 and the first ILD layer 160.

The first ILD layer 160 may include at least one drain contact 162 coupled to drain region 113, and body contacts 164 and 166 coupled to the well tap 145 and second well tap 147, respectively. The at least one drain contact 162 may extend through the first ILD layer 160 over the drain region 113 and may be coupled to a conductive field plate 177. The body contacts 164 and 166 may extend through the first ILD layer 160 over the well tap 145 and second well tap 147, respectively, and may be coupled to the conductive field plate 177. In other embodiments, the first ILD layer 160 may further include source contacts coupled to the source region 115 and the second source region 117 (not shown). The body contacts and the source contacts may have the same or different biasing. In the case where the body contacts and the source contacts are biased differently, the source region 115 and the well tap 145 may be separated by an isolation region, similarly the second source region 117 and the second well tap 147 may be separated by a further isolation region. For example, the drain contact 162 and body contacts 164 and 166 (and source contacts) may be formed of a conductive material such as copper (Cu), aluminum (Al), etc. Other suitable types of conductive material may also be useful.

As illustrated, the conductive field plate 177 may be arranged over the first ILD layer 160. The conductive field plate 177 may include a plate opening 179. The conductive field plate 177 may have a first plate portion 177a and a second plate portion 177b. The first plate portion 177a and the second plate portion 177b may be separated by the plate opening 179. The plate opening 179 may provide a relatively small spacing between the first plate portion 177a and the second plate portion 177b. The plate opening 179 may have a width w ranging from about 150 nm to about 200 nm, in a non-limiting example.

According to various embodiments, a drain captive structure 180 may be disposed in the first ILD layer 160 and adjacent to the drain region 113. The drain captive structure 180 may have a trench 182 comprising or consisting of an air gap 183 in the first ILD layer 160. The drain region 113 may partially underlap the drain captive structure 180. As shown in FIG. 1A, the drain captive structure 180 may be laterally spaced apart from sidewalls 122a and 122b of the gate 122. For example, the drain captive structure 180 may be displaced from the first sidewall 122a of the gate 122 by a predetermined distance. Similarly, the drain captive structure 180 may be laterally spaced apart from sidewalls 124a and 124b of the second gate 124. For example, the drain captive structure 180 may be displaced from the first sidewall 124a of the second gate 124 by a predetermined distance.

According to various embodiments, the air gap 183 of the drain captive structure 180 may be configured to surround the drain contact 162. The drain captive structure 180 may include a first ring-type barrier 184 and a second ring-type barrier 186 which defines the trench 182. The first ring-type barrier 184 and the second ring-type barrier 186 may each surround the drain contact 162. The first ring-type barrier 184 may be separated from the drain contact by dielectric material. For example, each of the first ring-type barrier 184 and the second ring-type barrier 186 may be a rectangular shaped ring barrier. However, it is understood that other shapes such circular, or a polygon may also be used. Each of the first ring-type barrier 184 and the second ring-type barrier 186 may be continuous and may have a closed configuration (e.g., a closed loop). The first ring-type barrier 184 and the second ring-type barrier 186 may serve as a dummy or shield to prevent portions of dielectric material of the first ILD layer 160 from being etched during formation of the air gap in the first ILD layer 160.

According to various embodiments, the first ring-type barrier 184 and the second ring-type barrier 186 and the drain contact 162 (and the body contacts 164 and 166) may be formed of a same conductive material. In some embodiments, the conductive field plate 177 may also be formed of the same conductive material as the first ring-type barrier 184 and the second ring-type barrier 186 and the drain contact 162. The conductive material, for example, may be a metal such as Cu or Al. In other embodiments, the conductive field plate 177, the first ring-type barrier 184, the second ring-type barrier 186 and the drain contact 162 may be formed of different materials.

Figure 1B:
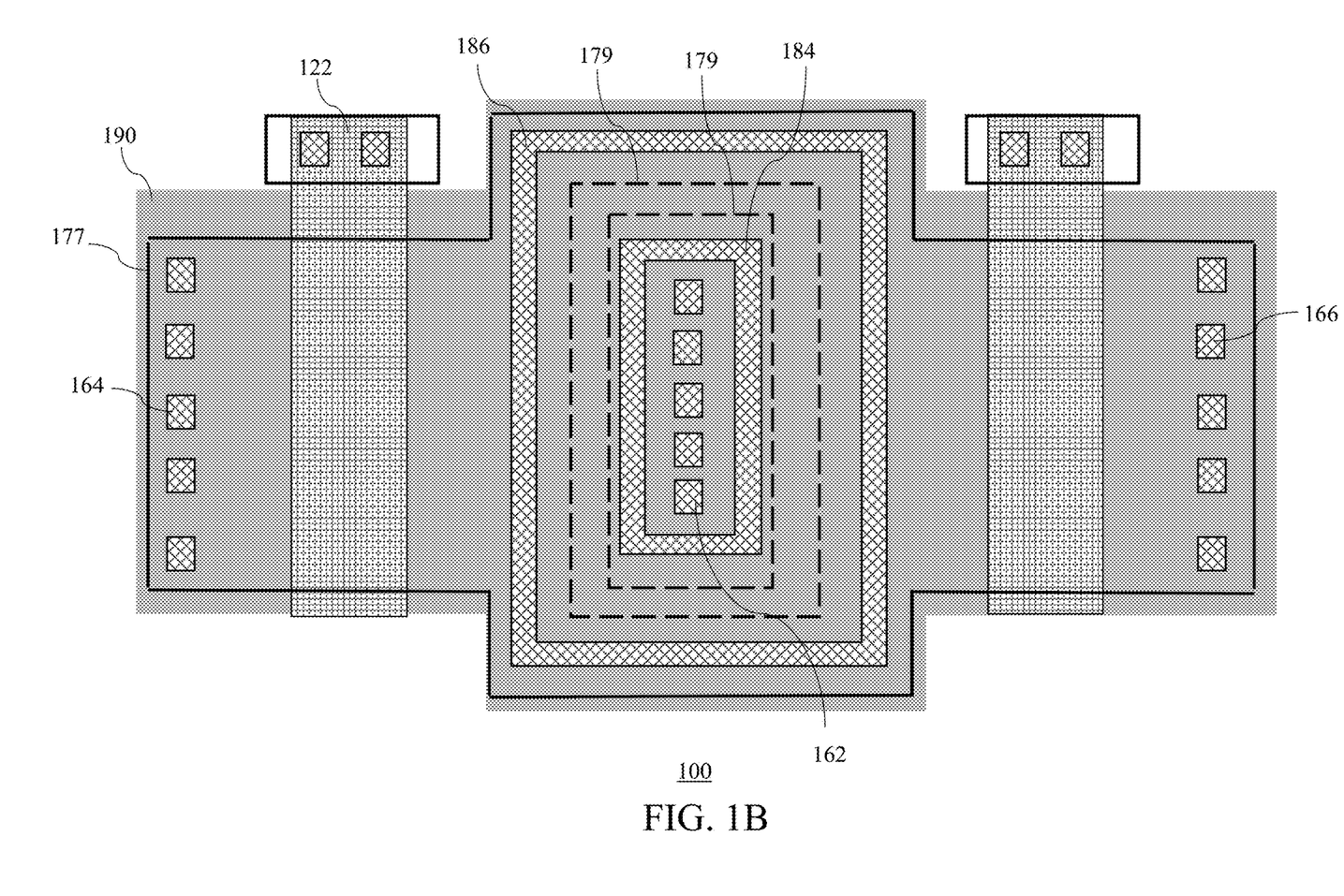
FIG. 1B shows a top view of an embodiment of the device.

FIG. 1B illustrates a top view of an embodiment of the semiconductor device 100 of FIG. 1A. The well tap, source region, drain region, drift well, second source region and second well tap may be formed within an active region 190 in the substrate. For purpose of illustration, the conductive field plate 177 is depicted with a solid line, while the plate opening 179 in the conductive field plate 177 is depicted with dashed lines. The plate opening 179 may be relatively small and having a width sufficient to enable dielectric material in the trench of the drain captive structure to be removed.

According to various embodiments, the conductive field plate 177 may extend to substantially cover the active area 195 of the device. The conductive field plate 177 may be an extended field plate. For example, the conductive field plate 177 may extend from the source side to the drain side of the device. The first plate portion 177a may cover a top surface of body contacts 164 and 166 and the second ring-type barrier 186. The second plate portion 177b may cover a top surface of the drain contact 162 and the first ring-type barrier 184. Providing the extended field plate increases the breakdown voltage of the device without increasing the on-state resistance. For example, providing the field plate which extend from the source region (and second source region) to the drain region helps to increase the breakdown voltage of a transistor by depleting the charge carriers in the drift region and reducing the surface electric field of the transistor.

Figure 1C:
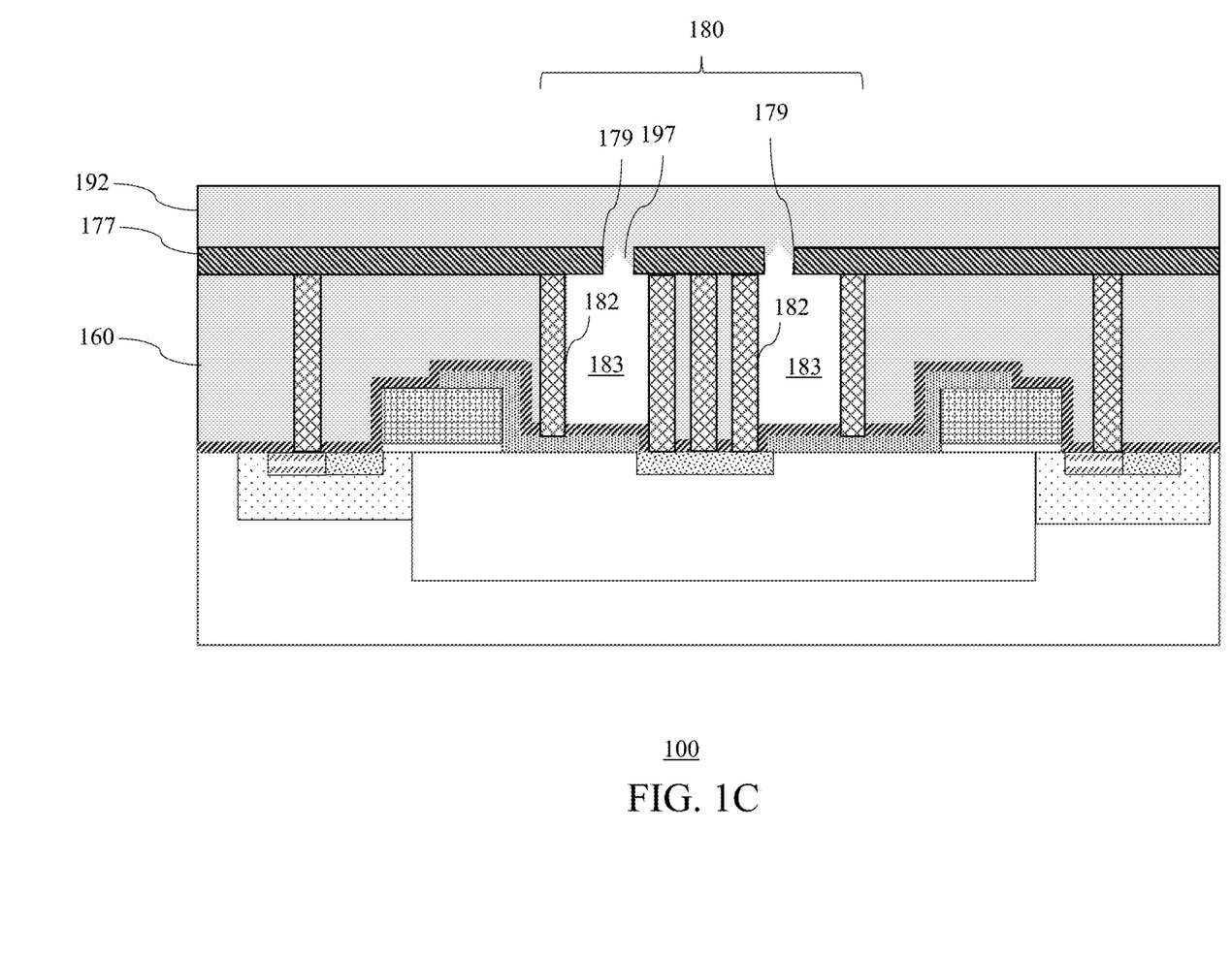
FIG. 1C shows a cross-sectional view of another embodiment of the device.

Referring to FIG. 1C, a second ILD layer 192 may be arranged over the first ILD layer 160. As illustrated, the second ILD layer 192 may be arranged over the conductive field plate 177. The second ILD layer 192 may be formed of a dielectric material, such as oxide, nitride, or combinations thereof. Other suitable types of dielectric materials are also useful. According to various embodiments, the plate opening 179 of the conductive field plate 177 pinches off dielectric material of the second ILD layer 192 to seal the air gap of the drain captive structure 180. For example, the plate opening 179 may have a relatively small width, ranging from about 150 nm to about 200 nm, in a non-limiting example, such that dielectric material of the second ILD layer 192 deposited over the conductive field plate 177 does not extend beyond the plate opening 179. As shown, a sealed off or pinched off dielectric portion 197 is formed in the plate opening 179. The sealed off dielectric portion 197 partially fills the plate opening 179 to seal the air gap 183, and does not extend beyond the plate opening 179.

The sealed off dielectric portion 197 may be formed by depositing dielectric material of the second ILD layer 192 using a high density plasma (HDP) process. For example, the second ILD layer 192 may be formed over the conductive field plate 177 using a HDP chemical vapor deposition (CVD) process. In the case the second ILD layer 192 is formed of a combination of nitride and oxide, the second ILD layer 192 may be formed by deposition of nitride (e.g., plasma enhanced CVD with high pressure), followed by deposition of oxide using the HDP process. Deposition of dielectric material using HDP process (e.g., deposition of the oxide) seals the plate opening 179 while forming an air gap or void 183 in the trench 182 and in the space of the plate opening 179 under the sealed off dielectric portion 197. During deposition of the dielectric material (e.g., oxide) of the second ILD layer 192 using the HDP process, the air gap 183 may be formed based on a deposition to sputtering (D/S) ratio of the HDP process, width of the plate opening 179 (e.g., critical dimension of the spacing of the conductive field plate 177), and thickness of the conductive field plate 177. The D/S ratio of the HDP process, width of the plate opening 179, and thickness of the conductive field plate 177 may be chosen such that the dielectric material of the second ILD layer 192 does not enter into the trench 182 of first dielectric layer 160 during deposition, forming the air gap 183 in the trench 182 and in the space of the plate opening 179 under the sealed off dielectric portion 197. In other words, the dielectric material of the second ILD layer 192 does not "fall" into the trench 182 of first dielectric layer 160 based on the process condition for the deposition, i.e., the HDP process for the deposition with a higher D/S ratio, a small width of the plate opening 179 and thickness of the conductive field plate 177.

Figure 1D:
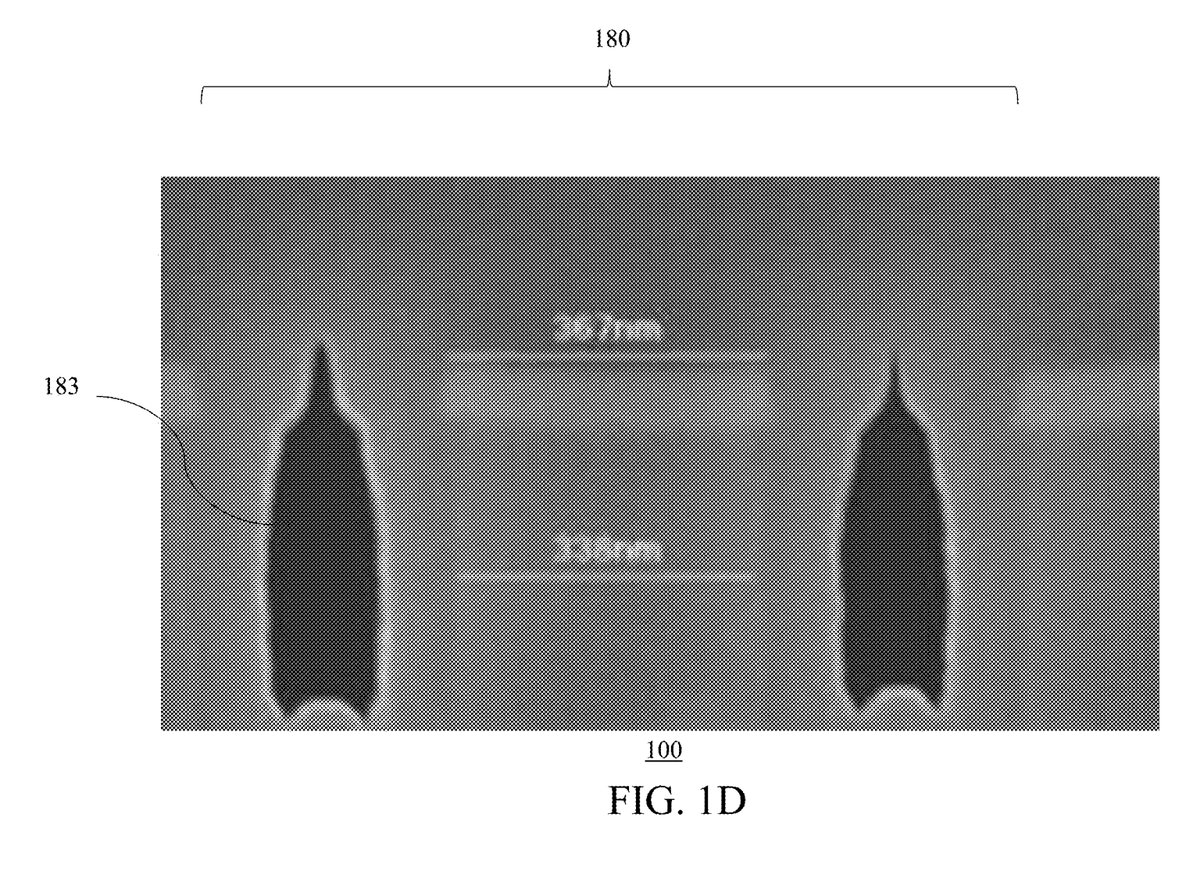
FIG. 1D shows an exemplary SEM image of the device having an air gap in a drain captive structure.

The deposition of the dielectric material of the second ILD layer 192 using the HDP process may be performed with a relatively higher D/S ratio to ensure the air gap 183 is formed in the trench 182, and the dielectric material of the second ILD layer 192 does not "fall" into the trench 182 during the deposition. The D/S ratio of the HDP process may depend on the width of the plate opening 179 (e.g., critical dimension of the spacing of the conductive field plate 177), and thickness of the conductive field plate 177. In a non-limiting example, in the case the conductive field plate 177 has a thickness of about 5um, the D/S ratio of the HDP process for the deposition of the dielectric material of the second ILD layer 192 may be about 4 or greater. In cases where the dielectric material of the second ILD layer 192 does fall into the trench 182 during deposition over the plate opening 179, it is of a small amount and may be left in the trench 182 as the air gap 183 is formed in the trench 182. FIG. 1D shows an exemplary SEM image of the device 100 having the air gap 183 in the drain captive structure 180.

According to various embodiments, an etch back process may be performed after the deposition of the oxide over the conductive field plate 177. The deposition of oxide using HDP process and the etch back may be performed alternately over the conductive field plate 177 having the small or narrow plate opening 179. When the duration of deposition (deposition time) is increased and the duration of etch (etch time) is reduced, the dielectric material (oxide) of the second ILD layer 192 does not fill the trench 182, and the air gap 183 may be formed in the trench 182 and in the plate opening 179 under the sealed off dielectric portion 197. In other words, the air gap 183 may be formed by controlling the deposition and etching in the geometrically narrow plate opening 179 of the conductive field plate 177.

The second ILD layer 192 may further include via contacts and conductive lines which interconnect to the conductive field plate 177.

According to various embodiments, the drain captive structure having the trench filled with air to form the air gap in the first ILD layer (or ILD) may lower or reduce the gate-drain capacitance $C_{gd}$ and gate charge $Q_g$. Providing the transistor devices with low gate-drain capacitance improves the switching speed of the transistor devices. Further, a low gate charge may be required to operate the transistor device. Additionally, providing the conductive field plate increases the breakdown voltage of the device without increasing the on-state resistance. Accordingly, the transistor device according to various embodiments may advantageously have a high breakdown voltage, low forward voltage drop, and fast switching speed.

FIGS. 2A-2D show cross-sectional views of an embodiment of a process 200 for forming a semiconductor device. The device, for example, is similar to that described in FIGS. 1A-1C. As such, common elements may not be described or described in detail.

Figure 2A:
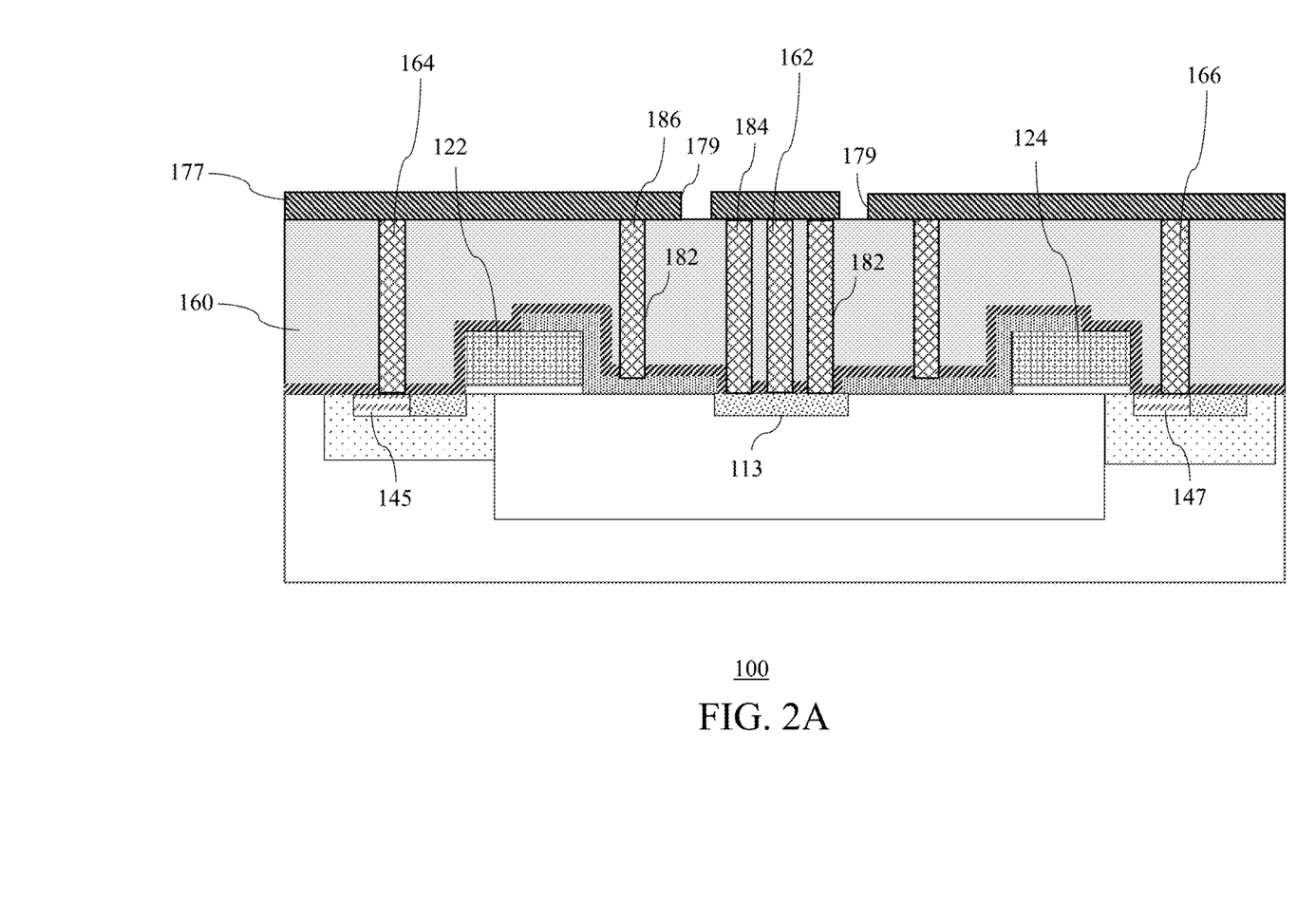
FIGS. 2A-2D show cross-sectional views of an embodiment of a process for forming a device.

Referring to FIG. 2A, a substrate 105 is provided. The substrate 105 may be a semiconductor substrate, such as a silicon substrate in a non-limiting embodiment. The substrate may be at least partially processed. The substrate, as shown, is at the stage of processing where at least a portion of an ILD has been formed over the substrate in a BEOL processing. For example, the first ILD layer 160 has been formed over the substrate, covering the gate 122 and the second gate 124. The first ILD layer 160 may be formed by chemical vapor deposition (CVD). Other techniques for forming the first ILD layer 160 may also be useful.

The drain contact(s) 162 and body contacts 164 and 166 may be formed in the first ILD layer 160. For example, via openings may be formed in the first ILD layer 160 by mask and etch techniques to expose the well taps 145 and 147 and the drain region 113. After the via openings are formed, a conductive material may be deposited to fill the via openings. The conductive material may be formed by, for example, plating, such as electro or electro-less plating. Other types of conductive layers or forming techniques may also be useful. A planarization process, such as chemical mechanical polishing (CMP), may be performed to remove excess conductive material, forming the drain contact 162 and body contacts 164 and 166 in the first ILD layer 160.

According to various embodiments, a first ring-type barrier 184 and a second ring-type barrier 186 may be formed in the first ILD layer 160. The first ring-type barrier 184 and a second ring-type barrier 186 may be formed to define a trench 182 of the drain captive structure. For example, openings corresponding to the first ring-type barrier 184 and the second ring-type barrier 186 may be formed in the first ILD layer 160 by mask and etch techniques, and a conductive material may be deposited to fill the openings. A planarization process, such as CMP, may be performed to remove excess conductive material, forming the first ring-type barrier 184 and the second ring-type barrier 186 in the first ILD layer 160. In some embodiments, the first ring-type barrier 184 and the second ring-type barrier 186 may be formed in the same process step as the drain contact 162 and body contacts 164 and 166.

A conductive field plate 177 may be formed over the first ILD layer 160. The conductive field plate 177 may be formed by depositing a conductive material over the first ILD layer 160. A plate opening 179 may be formed in the conductive field plate 177, for example, by mask and etch techniques. The plate opening may be formed to expose dielectric material in the trench 182.

Figure 2B:
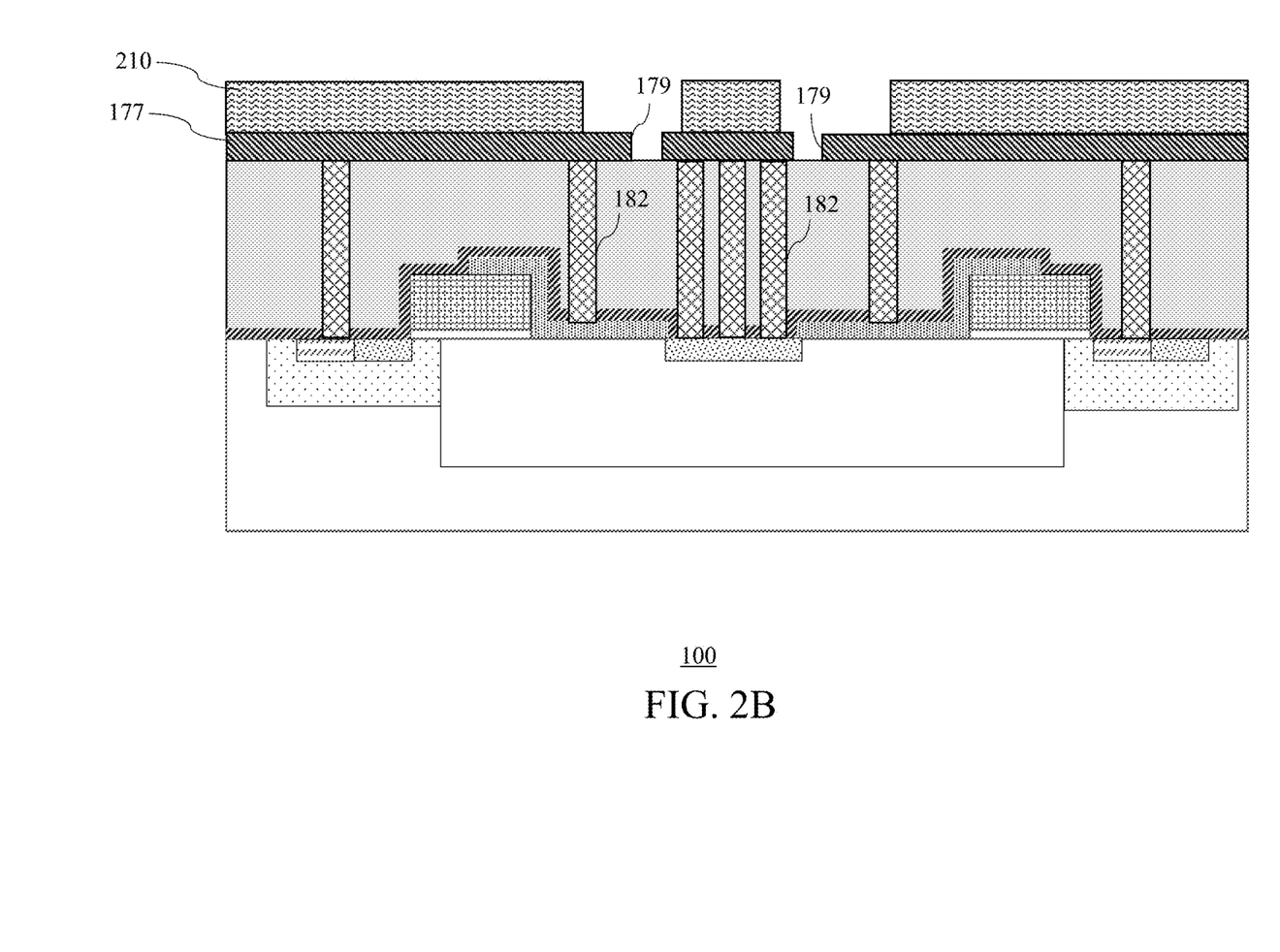

Referring to FIG. 2B, a patterned mask 210 such as a photoresist layer may be formed over the conductive field plate 177 to cover the conductive field plate 177, while exposing the plate opening 179 and portion of dielectric material in the first ILD layer 160. For example, a photoresist may be patterned by exposing it with an exposure source using a reticle with the desired pattern. After exposure, the photoresist may be developed, transferring the pattern of the reticle to the photoresist. The patterned photoresist may then be used as an etch mask to remove the dielectric material of the first ILD layer 160 in the trench 182.

Figure 2C:
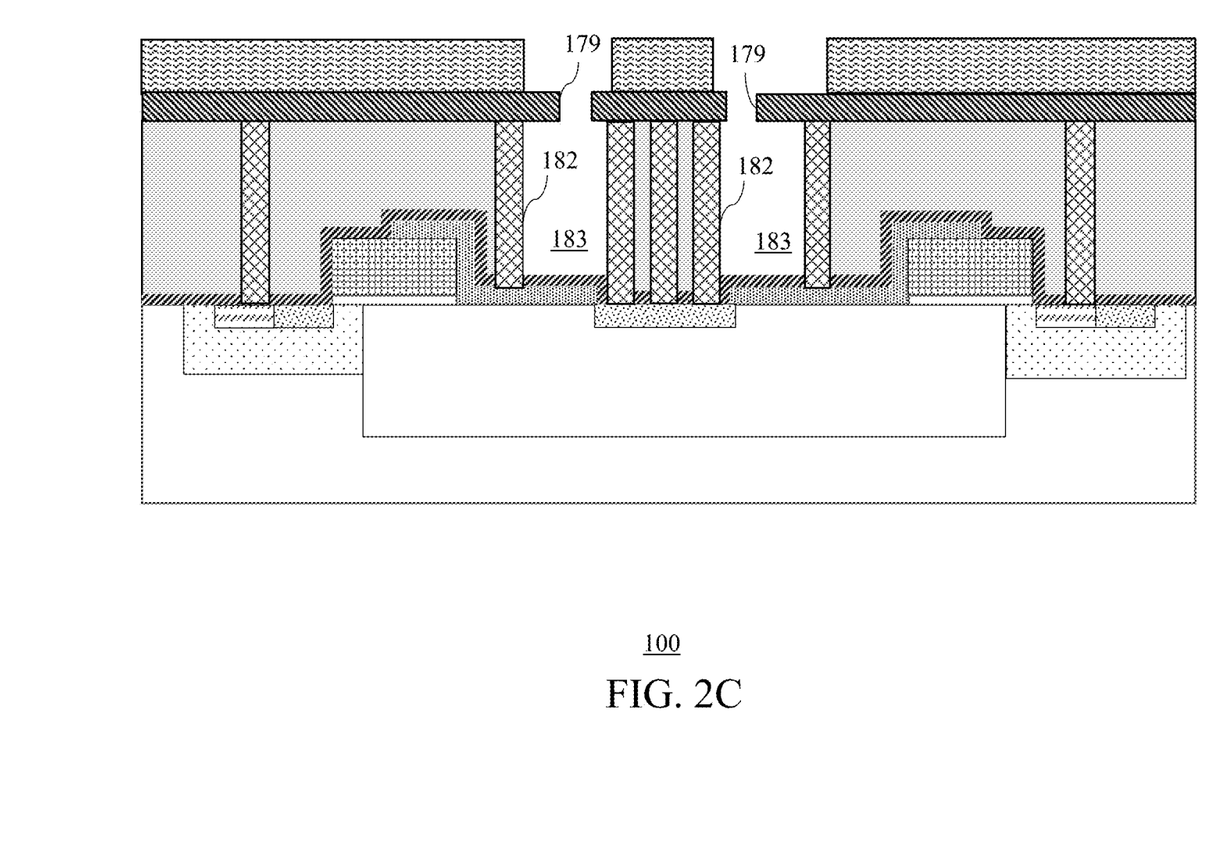

According to various embodiments, the dielectric material in the trench 182 may be removed through the plate opening 179. An etch, for example, using vapor hydrofluoric acid (VHF) may be performed to remove the dielectric material in the trench 182 through the plate opening 179. As illustrated in FIG. 2C, the trench 182 may be filled with air. The patterned mask may be removed, for example, by ashing in the case of a photoresist layer, after removing the dielectric material in the trench 182.

Figure 2D:
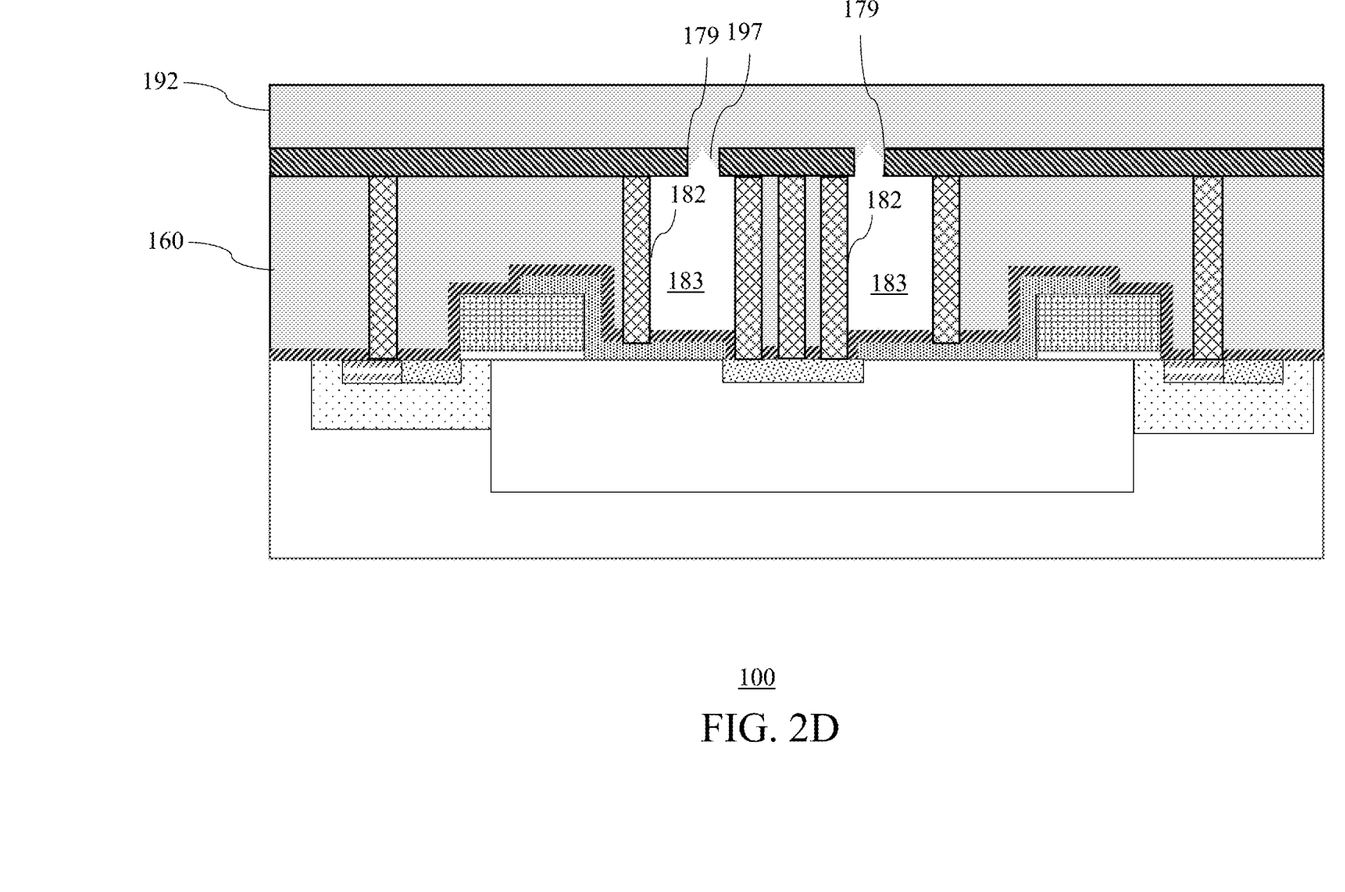

A second ILD layer 192 may be formed over the conductive field plate 177, forming a sealed off or pinched off dielectric portion 197 in the plate opening 179 to seal the air gap 183 of the drain captive structure in the first ILD layer 160. The plate opening 179 pinches off dielectric material of the second ILD layer 192 to form the sealed off dielectric portion 197. The second ILD layer 192, for example, may be deposited by plasma-enhanced CVD using high density plasma (HDP) process.

The HDP process is a plasma CVD process that includes simultaneous deposition and sputtering components and may employs a plasma having an ion density on the order of 1011 ions/cm3 or greater, in a non-limiting example. The relative levels of the combined deposition and sputtering characteristics of the high-density plasma may depend on such factors as the flow rates used to provide the gaseous mixture, the source power levels applied to maintain the plasma, the bias power applied to the substrate, in a non-limiting example. The combination of such factors may be quantified with the D/S to characterize the process:

$$\frac{D}{S} = \frac{\text{(net deposition rate)} + \text{(blanket sputtering rate)}}{\text{(blanket sputtering rate)}}$$

The D/S ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

The sealed off dielectric portion 197 may be formed by depositing dielectric material of the second ILD layer 192 over the conductive field plate 179 using the HDP process with a higher D/S ratio. In the case the second ILD layer 192 is formed of a combination of nitride and oxide, the second ILD layer 192 may be formed by deposition of nitride, followed by deposition of oxide using the HDP process. The deposition of nitride, for example, may be performed by plasma enhanced CVD with high pressure such that the nitride material lines the sidewalls of the plate opening 179 and/or trench 182, but does not fill the trench 182 and space in the plate opening 179. The deposition of oxide, for example, may be then performed using the HDP process with a higher D/S ratio. According to various embodiments, an etch back process may be performed after the deposition of the oxide over the conductive field plate 177. The deposition of oxide using HDP process and the etch back may be performed alternately over the conductive field plate 177 having the small or narrow plate opening 179. When the duration for the deposition (deposition time) is increased and the duration for the etch (etch time) is reduced, the dielectric material of the second ILD layer 192 does not fill the trench 182, and the air gap 183 may be formed in the trench 182 and in the plate opening 179 under the sealed off dielectric portion 197. In other words, the air gap 183 may be formed by controlling the deposition and etching of the dielectric material of the second ILD layer 192 over the geometrically narrow plate opening 179 of the conductive field plate 177. The second ILD layer may then be planarized by, for example, using a CMP process.

In addition, conductive vias and conductive lines (not shown) may be formed in the second ILD layer 192. An optional thermal treatment may be performed after deposition of the second ILD layer 192. Additional processes may be performed to complete the device. Such processes may include forming additional interconnect metal levels, final passivation, dicing, packaging, testing, etc.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor device comprising:
   a substrate having a source region and a drain region;
   a gate arranged over the substrate and between the source region and the drain region;
   a first interlevel dielectric (ILD) layer at least partially arranged over the substrate and the gate;
   a conductive field plate arranged over the first ILD layer, wherein the conductive field plate comprises a first plate portion and a second plate portion separated by a plate opening;
   at least one drain contact extending through the first ILD layer over the drain region and physically coupled to the conductive field plate;
   a drain captive structure disposed in the first ILD layer and partially over the drain region, the drain captive structure comprises a first ring-type barrier and a second ring-type barrier, wherein each of the first ring-type barrier and the second ring-type barrier surrounds the at least one drain contact, and the first ring-type barrier and the second ring-type barrier define a trench therebetween, wherein the trench comprises an air gap, and wherein the drain captive structure is laterally spaced apart from sidewalls of the gate;
   wherein the first plate portion overlaps and directly contacts the second ring-type barrier, and the second plate portion is a continuous plate which overlaps and directly contacts the at least one drain contact and the first ring-type barrier.

2. The device of claim 1, wherein the air gap disposed between the first ring-type barrier and the second ring-type barrier surrounds the at least one drain contact in a continuous loop.

3. The device of claim 1, wherein the first ring-type barrier is separated from the at least one drain contact by a dielectric material.

4. The device of claim 1, wherein the first ring-type barrier and the second ring-type barrier and the at least one drain contact are formed of a same conductive material.

5. The device of claim 1, wherein the substrate further comprises a second source region, and further comprising a second gate arranged over the substrate and between the second source region and the drain region.

6. The device of claim 1, further comprising a second ILD layer arranged over the conductive field plate, wherein the plate opening comprises a sealed off portion of a dielectric material of the second ILD layer to seal the air gap in the drain captive structure.

7. The device of claim 1, wherein the drain region underlaps the first ring-type barrier.

8. The device of claim 1, further comprising a body well, a well tap, and a drift well disposed in the substrate, wherein the body well surrounds the source region and the well tap, and extends at least partially under a first portion of the gate, and the drift well surrounds the drain region and extends at least partially under a second portion of the gate.

9. The device of claim 8, wherein the body well abuts the drift well.

10. The device of claim 1, wherein each of the first ring-type barrier and the second ring-type barrier includes a respective ring portion that is disposed between the at least one drain contact and the gate and wherein the first plate portion extends continuously over the gate from the source region to the second ring-type barrier.

11. The device of claim 10, wherein the first plate portion and the second plate portion are co-planar, wherein the first plate portion overhangs the second ring-type barrier and the second plate portion extends continuously over the drain region from the at least one drain contact to the first ring-type barrier and overhangs the first ring-type barrier, wherein the plate opening is disposed directly above the air gap and comprises a ring-like shape, and wherein a width of the air gap is defined by the first ring-type barrier and the second ring-type barrier and a width of the plate opening is narrower than the width of the air gap.

12. The device of claim 11, further comprising:
   a well tap laterally adjacent to the source region; and a body contact extending through the first ILD layer, the body contact physically coupling the well tap to the first plate portion.

13. The device of claim 12, wherein the at least one drain contact comprises a plurality of drain contacts and wherein the first ring-type barrier directly contacts the drain region, and wherein the body contact is one of a plurality of body contacts extending through the first ILD layer, the plurality of body contacts physically coupling the well tap to the first plate portion.

14. A method of forming a semiconductor device, comprising:
providing a substrate having a source region and a drain region, a gate arranged over the substrate and between the source region and the drain region, and a first interlevel dielectric (ILD) layer at least partially arranged over the substrate and the gate;
forming at least one drain contact extending through the first ILD layer over the drain region;
forming a conductive field plate over the first ILD layer, wherein the conductive field plate comprises a first plate portion and a second plate portion separated by a plate opening; and
forming a drain captive structure in the first ILD layer and partially over the drain region, the drain captive structure comprises a first ring-type barrier and a second ring-type barrier, wherein each of the first ring-type barrier and the second ring-type barrier surrounds the at least one drain contact, and the first ring-type barrier and the second ring-type barrier define a trench therebetween, wherein the trench comprises an air gap, and wherein the drain captive structure is laterally spaced apart from sidewalls of the gate;
wherein the first plate portion overlaps and directly contacts the second ring-type barrier, and the second plate portion is a continuous plate which overlaps and directly contacts the at least one drain contact and the first ring-type barrier.

15. The method of claim 14, wherein the air gap disposed between the first ring-type barrier and the second ring-type barrier surrounds the at least one drain contact in a continuous loop.

16. The method of claim 14, wherein the first ring-type barrier is separated from the at least one drain contact by a dielectric material.

17. The method of claim 14, wherein the first ring-type barrier and the second ring-type barrier and the at least one drain contact are formed of a same conductive material.

18. The method of claim 14, wherein the substrate further comprises a second source region, and further comprising a second gate arranged over the substrate and between the second source region and the drain region.

19. The method of claim 14, further comprising a second ILD layer arranged over the conductive field plate, wherein the plate opening comprises a sealed off portion of a dielectric material of the second ILD layer to seal the air gap in the drain captive structure.

20. The method of claim 14, wherein the drain region underlaps the first ring-type barrier.

* * * * *